(12) United States Patent
Tsukamoto

(10) Patent No.: US 9,018,031 B2
(45) Date of Patent: Apr. 28, 2015

(54) MANUFACTURING METHOD OF SOLID-STATE IMAGE SENSOR

(71) Applicant: Panasonic Corporation, Osaka (JP)

(72) Inventor: Akira Tsukamoto, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/061,750

(22) Filed: Oct. 23, 2013

(65) Prior Publication Data

US 2014/0051203 A1  Feb. 20, 2014

Related U.S. Application Data

(60) Division of application No. 13/220,079, filed on Aug. 29, 2011, now abandoned, which is a continuation of application No. PCT/JP2009/005509, filed on Oct. 21, 2009.

(30) Foreign Application Priority Data

Mar. 18, 2009 (JP) .................................. 2009-066877

(51) Int. Cl.
H01L 31/18 (2006.01)
H01L 27/146 (2006.01)

(52) U.S. Cl.
CPC .......... *H01L 27/14689* (2013.01); *H01L 31/18* (2013.01); *H01L 31/1892* (2013.01);
(Continued)

(58) Field of Classification Search
CPC .............. H01L 27/146; H01L 27/1464; H01L 27/14643; H01L 27/14632; H01L 27/14687; H01L 27/14689; H01L 31/18; H01L 31/1892

USPC .................... 438/455, 459, 977, 73
See application file for complete search history.

(56) References Cited

U.S. PATENT DOCUMENTS 5,374,564 A    12/1994 Bruel
5,641,714 A *  6/1997 Yamanaka ...................... 438/14
(Continued)

FOREIGN PATENT DOCUMENTS

JP    2959704 A    10/1996
JP    10-308355 A  11/1998
(Continued)

OTHER PUBLICATIONS

Office Action issued in U.S. Appl. No. 13/220,079 with Date mailed Oct. 1, 2012.
(Continued)

*Primary Examiner* — Mary Wilczewski
(74) *Attorney, Agent, or Firm* — McDermott Will & Emery LLP

(57) ABSTRACT

A single crystal silicon layer is formed on a principal surface of a first wafer by epitaxial growth. A silicon oxide layer is formed on the single crystal silicon layer. Next, a defect layer is formed inside the single crystal silicon layer by ion implantation, and then, the second wafer is bonded to the silicon oxide layer on the first wafer. After that, an SOI wafer including the silicon oxide layer formed on the second wafer and the single crystal silicon layer formed on the silicon oxide layer is formed by separating the first wafer including the single crystal silicon layer from the second wafer including the single crystal silicon layer in the defect layer. Then, a photodiode is formed in the single crystal silicon layer. An interconnect layer is formed on a surface of the single crystal silicon layer which is opposite to the silicon oxide layer.

5 Claims, 11 Drawing Sheets

(52) U.S. Cl.
CPC ........ *H01L27/146* (2013.01); *H01L 27/14632* (2013.01); *H01L 27/1464* (2013.01); *H01L 27/14687* (2013.01); *H01L 27/14643* (2013.01); *Y10S 438/977* (2013.01)

(56) References Cited

U.S. PATENT DOCUMENTS

| | | |
|---|---|---|
| 6,251,754 B1 | 6/2001 | Ohshima et al. |
| 6,312,797 B1 | 11/2001 | Yokokawa et al. |
| 6,960,799 B2 | 11/2005 | Descure |
| 7,180,112 B2 | 2/2007 | Yokozawa |
| 7,335,963 B2 | 2/2008 | Ford |
| 7,425,460 B2 | 9/2008 | Pain |
| 7,741,667 B2 | 6/2010 | Jung |
| 7,781,715 B2 | 8/2010 | Uya et al. |
| 7,919,827 B2 | 4/2011 | Wu et al. |
| 7,932,546 B2 | 4/2011 | Jeong et al. |
| 7,968,923 B2 | 6/2011 | Nagaraja et al. |
| 7,989,908 B2 | 8/2011 | Kim |
| 8,013,411 B2 | 9/2011 | Cole |
| 8,211,732 B2 | 7/2012 | Chen |
| 2006/0068586 A1 | 3/2006 | Pain |
| 2006/0076590 A1 | 4/2006 | Pain et al. |
| 2008/0173965 A1 | 7/2008 | Cole |
| 2008/0283726 A1 | 11/2008 | Uya et al. |
| 2009/0200631 A1 | 8/2009 | Tai et al. |
| 2009/0242951 A1 | 10/2009 | Ueno et al. |
| 2010/0207014 A1 | 8/2010 | Hashimoto |
| 2010/0301439 A1 | 12/2010 | Yamamoto et al. |
| 2010/0311182 A1 | 12/2010 | Gilton |

FOREIGN PATENT DOCUMENTS

| | | |
|---|---|---|
| JP | 10-321548 A | 12/1998 |
| JP | 2000-049063 A | 2/2000 |
| JP | 3048201 A | 3/2000 |
| JP | 3385972 A | 1/2003 |
| JP | 2005-259828 A | 9/2005 |
| JP | 2008-103668 A | 5/2008 |
| JP | 2008-514011 A | 5/2008 |

OTHER PUBLICATIONS

Office Action issued in U.S. Appl. No. 13/220,079 with Date mailed Mar. 14, 2013.
Shimura, Fumio "Semiconductor Silicon Crystal Technology", partial English translation, pp. 62-69 and pp. 76-85, 1993.
W. G. Pfann "Principles of Zone-Melting" Transactions of the American Institue of Mining and Metallurgical Engineers. vol. 194, pp. 747-753, 1952.
Carl Wagner "Theoretical Analysis of Diffusion of Solutes During the Solidification of Alloys" Transactions of the American Institue of Mining and Metallurgical Engineers. vol. 200, pp. 154-160, 1954.
J. A. Burton et al. "The Distribution of Solute in Crystals Grown from the Melt. Part I. Theoretical" The Journal of Chemical Physics, vol. 21, No. 11, pp. 1987-1991, Nov. 1953.
Office Action issued in U.S. Appl. No. 13/220,079 with Date mailed Jul. 24, 2013.

* cited by examiner

MANUFACTURING METHOD OF SOLID-STATE IMAGE SENSOR

CROSS-REFERENCE TO RELATED APPLICATION

This application is a Divisional of application Ser. No. 13/220,079, filed Aug. 29, 2011, which is a continuation of PCT International Application PCT/JP2009/005509, filed on Oct. 21, 2009, which in turn claims benefit of Japanese Patent Application No. 2009-066877, filed on Mar. 18, 2009, the entire contents of each of which are incorporated herein by reference.

BACKGROUND

The present disclosure relates to solid-state image sensors and manufacturing methods of the sensors, and more particularly to solid-state image sensors using silicon-on-insulator (SOI) substrates and manufacturing methods of the sensors.

Solid-state image sensors such as charge coupled devices (CCDs), CMOS image sensors, etc., are generally used for digital cameras, video cameras, etc. In recent years, with an improvement in solid-state image sensors, high-definition images can be obtained by a solid-state image sensor with highly dense pixels.

A conventional solid-state image sensor includes a transfer gate, a photoelectric conversion element, a MOS transistor, various interconnects, etc. on a semiconductor substrate. However, a light-receiving region of a photoelectric conversion element needs to be provided avoiding the transfer gate, the MOS transistor, the interconnects, etc. There is thus the problem that the aperture ratio of the light-receiving region reduces with a reduced pixel size due to reduction in the area of the semiconductor substrate and an increase in the number of pixels.

Thus, in recent years, increasing attention has been given to a solid-state image sensor of back surface irradiation including a transfer gate, a MOS transistors, and an interconnect layer on a first (front) surface of a semiconductor substrate, and a photoelectric conversion element on a second (back) surface so that the back surface serves as a light-receiving region.

A substrate of a solid-state image sensor of back surface irradiation needs to be thinned to a thickness of 3-10 μm. As a means of thinning, polishing or etching of a conventional silicon substrate from a back surface is considered, but the means is less controllable in uniformly reducing the thickness of an initial substrate, which is usually 500 μm, to 10 μm or less.

For example, Japanese Translation of PCT International Application No. 2008-514011 shows a manufacturing method of a solid-state image sensor of back surface irradiation using an SOI wafer including a single crystal silicon layer on a silicon oxide layer.

In the manufacturing method shown in Japanese Translation of PCT International Application No. 2008-514011, the SOI wafer including the silicon oxide layer formed on a base wafer, and the single crystal silicon layer formed on the silicon oxide layer is used. The method includes forming a photoelectric conversion element on the single crystal silicon layer with a light-receiving section facing the silicon oxide layer of the single crystal silicon layer, forming an interconnect layer on a surface of the single crystal silicon layer which is opposite to the surface closer to the silicon oxide layer, and selectively removing the base wafer under the silicon oxide layer.

As representative manufacturing methods of an SOI wafer, roughly two types of separation by implanted oxygen (SIMOX) and bonding are known. The SIMOX is a manufacturing method of an SOI wafer utilizing the feature that a silicon oxide layer is formed inside a silicon substrate and a recrystallized silicon layer is formed near the surface of the silicon substrate by ion-implanting highly concentrated oxygen into the silicon substrate with highly accelerated energy and performing heat treatment. This method accurately controls the depth for ion implantation, thereby providing excellent uniformity of the thickness of the recrystallized silicon layer formed near the surface of the silicon substrate. However, a non-single crystal silicon oxide layer occurs in the heat treatment, and the recrystallized silicon layer is formed on the non-single crystal silicon oxide layer, thereby causing a large number of crystal defects in the recrystallized silicon layer. Although considerable efforts have been made to reduce the crystal defects, the problem is not yet overcome, since the mechanism of occurrence of the defects is intrinsic. The defects are considered difficult to overcome in the future.

Then, wafer bonding was suggested. A Unibond technique (Smart Cut (registered trademark)) is practically the current mainstream.

In the Unibond technique, a silicon oxide film is formed on the surface of a silicon substrate, hydrogen ions are implanted via the formed silicon oxide film, and then the silicon oxide film of the silicon substrate is bonded to a base wafer (supporting substrate). After that, heat treatment is performed and the silicon substrate is separated in the implanted position, thereby providing a method (hydrogen ion implantation separation) of forming an SOI wafer. This technique is shown in, e.g., Japanese Patent No. 2959704, or Japanese Patent No. 3385972.

As the method of separating the hydrogen ions, a silicon oxide film is formed on at least one of two silicon wafers. Hydrogen ions or noble gas ions are implanted from above a first silicon wafer, thereby forming a defect layer (a sealing layer) inside the silicon wafer. Then, the silicon wafer is adhered to the other silicon wafer via the silicon oxide film and heat treatment (separation heat treatment) is performed to separate one of the wafers to be a thin film using the defect layer as a surface to be cleaved (surface to be separated). With further heat treatment (bonding heat treatment) is performed to strengthen the bonding, thereby forming an SOI wafer.

SUMMARY

A silicon wafer used in manufacturing an SOI wafer is usually formed by Czochralski (CZ) growth. In the CZ growth, massive polycrystalline silicon is put into a crucible made of quartz and melted by resistance heating in an argon atmosphere. A silicon ingot comes into contact with single crystal silicon as a seed and is pulled up while gradually rotating to manufacture the silicon ingot. The resistivity of silicon is controlled by the concentration of a dopant, but the resistivity in the axial direction and the in-plane direction is difficult to uniform. Variations in concentric resistivity, oxygen concentration, etc. caused by the pull-up of the silicon wafer produced by the CZ growth are referred to as "swirls." FIG. 9 is a schematic view of a swirl representing the magnitude of resistivity by concentration. Even with such a problem, single crystals can be formed with a great opening size of 300 mm or more depending on a pull-up machine, and thus, wafers with a great opening size used in manufacture of semiconductors in recent years are all produced by the CZ growth.

SOI wafers manufactured by hydrogen ion implantation separation using silicon wafers produced by the CZ growth are in practical use mainly in logic LSI manufactures. In usually manufactured SOI wafers, variations in resistivity caused by the CZ growth are not problematic.

A manufacturing method of a solid-state image sensor of back surface irradiation using an SOI wafer, which is formed by hydrogen ion implantation separation using a silicon wafer produced by CZ growth as a material, will be described below.

FIGS. 10A-10E and 11A-11E are cross-sectional views illustrating a manufacturing method of a solid-state image sensor of back surface irradiation using a conventional SOI wafer.

As shown in FIG. 10A, a bond wafer 5 made of single crystal silicon is prepared. The bond wafer 5 is made of single crystal silicon produced by CZ growth. P-type impurities are implanted into the bond wafer 5 so that the bond wafer 5 will be a p-well 6 of a completed solid-state image sensor 3 shown in FIG. 11E. The bond wafer 5 is shown in the figure so that the principal surface faces downwards.

Then, as shown in FIG. 10B, the bond wafer 5 is thermally oxidized to form a silicon oxide layer 7. While only the silicon oxide layer 7 on the principal surface is shown in the figure, silicon oxide films are actually formed on the back and side surfaces as well.

Next, as shown in FIG. 10C, hydrogen ions are implanted from the principal surface of the bond wafer 5. Accelerated energy for implanting the hydrogen ions is controlled to adjust the depth of a defect layer 8, which is caused by the hydrogen ion implantation, from the principal surface of the bond wafer 5. This determines the thickness of a single crystal silicon layer 9 being an upper layer when an SOI wafer 1 is completed, which will be described later with reference to FIG. 11A.

Then, as shown in FIG. 10D, the surfaces of the bond wafer 5 and a base wafer 2 for maintaining the strength of the SOI wafer 1 are cleaned and bonded. The base wafer 2 is made of single crystal silicon produced by CZ growth.

After that, as shown in FIG. 10E, the base wafer 2 and the bond wafer 5 are separated from the back surface, thereby separating part of the bond wafer 5 from the base wafer 2 in the defect layer 8. The part of the bond wafer 5 separated from the base wafer 2 is returned to the oxidation shown in FIG. 10B, and may be reused in manufacture of another SOI wafer.

Then, heat treatment is performed to strengthen the bonding of the bonded surfaces. Normally, it is said that bonding of bonded surfaces is strengthen by heat treatment at a temperature of 1000° C. A method of lowering the temperature of the heat treatment by pretreatment with plasma, etc. is also considered.

With the above-described processes, as shown in FIG. 11A, the SOI wafer 1 is completed, which includes the base wafer 2, the silicon oxide layer 7, and the single crystal silicon layer 9.

FIG. 11B illustrates forming photodiodes 4 and drains 11 in the single crystal silicon layer 9 which is the uppermost layer of the SOI wafer 1, and forming read-out gates 10 and interconnects 12 on the single crystal silicon layer 9 to form a solid-state MOS image sensor. In the case of a solid-state CCD image sensor, photodiodes, charge transfer sections, gate electrodes and interconnects are used instead. The photodiodes 4 are formed by ion-implanting impurities such as arsenic (As), properties (P), etc. into a p-type substrate.

Then, as shown in FIG. 11C, the base wafer 2 is removed from the SOI wafer 1. When the base wafer 2 is made of single crystal silicon, it can be easily removed by etching with an alkali solution. The intermediate silicon oxide layer 7 is not etched with the alkali solution, it can be thus processed with thickness accuracy equal to that in manufacturing the SOI wafer 1. This is the greatest advantage of using the SOI wafer 1. At this time, when removing the base wafer 2 from the entire surface of the SOI wafer 1, the strength of the wafer is insufficient, and thus, an extra support wafer for reinforcement is to be bonded on the front surface provided with the interconnects 12, etc. The support wafer is however, not shown in the figure.

After that, as shown in FIG. 11D, boron ($B^+$) ions are implanted from the surface provided with the silicon oxide layer 7 to form a $p^+$ type depletion barrier layer 13 near the interface in the single crystal silicon layer 9 between the single crystal silicon layer 9 and the silicon oxide layer 7. The depletion barrier layer 13 blocks spread of the depletion layers of the photodiodes 4 to the interface with the silicon oxide film and prevents noise electrons generated at interface states from being accumulated at the photodiodes 4 and becoming dark signals.

Next, as shown in FIG. 11E, color filters 14 and on-chip microlenses 15 are formed on the silicon oxide layer 7 being the back surface of the SOI wafer 1. Then, the solid-state image sensor 3 of back surface irradiation is completed.

The manufacturing method of the solid-state image sensor of back surface irradiation using the conventional SOI wafer is excellent in uniformly and controllably thinning the silicon wafer. However, slight variations in the resistivity of the substrate influence characteristics of the individual photodiodes, and lead to variations in sensitivity and the amount of saturated signals. As a result, fixed pattern noise occurs in an obtained image due to a swirl shown in FIG. 12.

In view of the problem, it is an objective of the present disclosure to reduce variations in resistivity of a substrate and to reduce degradation in the quality of an obtained image in a solid-state image sensor using an SOI substrate.

In order to achieve the objective, the present disclosure provides a manufacturing method of a solid-state image sensor implemented by a structure using an SOI wafer made of single crystal silicon formed by epitaxial growth.

Specifically, a manufacturing method of a first solid-state image sensor according to the present disclosure includes forming a single crystal silicon layer on a principal surface of a first wafer by epitaxial growth; forming a silicon oxide layer on the single crystal silicon layer; forming a defect layer inside the single crystal silicon layer by ion implantation; bonding the second wafer to the silicon oxide layer on the first wafer; forming an SOI wafer including the silicon oxide layer formed on the second wafer and the single crystal silicon layer formed on the silicon oxide layer by separating the first wafer including the single crystal silicon layer from the second wafer including the single crystal silicon layer in the defect layer; forming a photodiode in the single crystal silicon layer; and forming an interconnect layer including a photodiode charge read-out structure on a surface of the single crystal silicon layer which is opposite to the silicon oxide layer.

In the manufacturing method of the first solid-state image sensor according to the present disclosure, the first solid-state image sensor according to the present disclosure does not include single crystal silicon produced by CZ growth, which inevitably has concentric variations in impurity concentration. This prevents fixed pattern noise occurring in the solid-state image sensor manufactured by a conventional manufacturing method. This enables manufacture of a solid-state image sensor with reduced degradation in the quality of an obtained image.

The manufacturing method of the first solid-state image sensor according to the present disclosure may further include, after forming the interconnect layer, selectively etching part of or the entire second wafer with respect to the silicon oxide layer. In forming the photodiode, the light-receiving section of the photodiode is formed to face the silicon oxide layer.

A manufacturing method of a second solid-state image sensor according to the present disclosure includes forming a first single crystal silicon layer on a principal surface of a first wafer by epitaxial growth; forming a silicon oxide layer on the first single crystal silicon layer; forming a defect layer inside the first single crystal silicon layer by ion implantation; bonding the second wafer to the silicon oxide layer on the first wafer; forming an SOI wafer including the silicon oxide layer formed on the second wafer and the first single crystal silicon layer formed on the silicon oxide layer by separating the first wafer including the first single crystal silicon layer from the second wafer including the first single crystal silicon layer in the defect layer; forming a second single crystal silicon layer on the first single crystal silicon layer by epitaxial growth; forming a photodiode in the first single crystal silicon layer or the second single crystal silicon layer; and forming an interconnect layer including a photodiode charge read-out structure on a surface of the second single crystal silicon layer which is opposite to the first single crystal silicon layer.

In the manufacturing method of the second solid-state image sensor according to the present disclosure, the second solid-state image sensor does not include single crystal silicon produced by CZ growth, which inevitably has variations in impurity concentration. This prevents fixed pattern noise occurring in the solid-state image sensor manufactured by a conventional manufacturing method. This enables manufacture of a solid-state image sensor with reduced degradation in the quality of an obtained image. Furthermore, read-out gates, drains, interconnects, etc. of the solid-state image sensor can be formed on the surface of the defect free second single crystal silicon layer, thereby further improving the image quality of the solid-state image sensor.

The manufacturing method of the second solid-state image sensor according to the present disclosure may further include, after forming the interconnect layer, selectively etching part of or the entire second wafer with respect to the silicon oxide layer. In forming the photodiode, the light-receiving section of the photodiode is formed to face the silicon oxide layer.

A manufacturing method of a third solid-state image sensor according to the present disclosure includes forming a first single crystal silicon layer having impurity concentration of $1\times10^{17}$ $cm^{-3}$ or more on a principal surface of a first wafer by epitaxial growth; forming a silicon oxide layer on the first single crystal silicon layer; forming a defect layer inside the first single crystal silicon layer by ion implantation; bonding the second wafer to the silicon oxide layer on the first wafer; forming an SOI wafer including the silicon oxide layer formed on the second wafer and the first single crystal silicon layer formed on the silicon oxide layer by separating the first wafer including the first single crystal silicon layer from the second wafer including the first single crystal silicon layer in the defect layer; forming a second single crystal silicon layer having lower impurity concentration than the first single crystal silicon layer on the first single crystal silicon layer by epitaxial growth; forming a photodiode in the second single crystal silicon layer so that a light-receiving section faces the silicon oxide layer; forming an interconnect layer including a photodiode charge read-out structure on a surface of the second single crystal silicon layer which is opposite to the first single crystal silicon layer; and selectively etching part of or the entire second wafer with respect to the silicon oxide layer.

In the manufacturing method of the third solid-state image sensor according to the present disclosure, the third solid-state image sensor does not include single crystal silicon produced by CZ growth, which inevitably has variations in impurity concentration. This prevents fixed pattern noise occurring in the solid-state image sensor manufactured by a conventional manufacturing method. This enables manufacture of a solid-state image sensor with reduced degradation in the quality of an obtained image. Furthermore, read-out gates, drains, interconnects, etc. of the solid-state image sensor can be formed on the surface of the defect free second single crystal silicon layer, thereby further improving the image quality of the solid-state image sensor. There is no need to form a depletion barrier layer by ion implantation to perform activation annealing after forming the read-out gates, interconnects, etc. Thus, a negative influence of heat treatment on the interconnects, etc. can be avoided.

In the manufacturing method of the third solid-state image sensor according to the present disclosure, the first single crystal silicon layer is preferably of a first conductivity type. The second single crystal silicon layer is preferably of a second conductivity type. The photodiode is preferably of the second conductivity type.

In the manufacturing method of the third solid-state image sensor according to the present disclosure, the first single crystal silicon layer may be of a first conductivity type. The second single crystal silicon layer may be of a second conductivity type. The forming of the photodiode may include forming a well of the first conductivity type in the second single crystal silicon layer. The photodiode may be of the second conductivity type, and may be formed in the well.

A solid-state image sensor according to the present disclosure includes a plate-like single crystal silicon layer formed by epitaxial growth, and including a first surface and a second surface facing the first surface, an interconnect layer provided on the first surface of the single crystal silicon layer and including a photodiode charge read-out structure; and a plurality of photodiodes formed in the single crystal silicon layer so that light-receiving sections face the second surface.

The solid-state image sensor according to the present disclosure does not include single crystal silicon produced by CZ growth, which inevitably has variations in impurity concentration. This prevents fixed pattern noise occurring in a conventional solid-state image sensor.

The solid-state image sensor according to the present disclosure may further include an insulating film provided on the second surface of the single crystal silicon layer, and color filters provided on the insulating film to correspond to the photodiodes.

The solid-state image sensor according to the present disclosure may further include on-chip microlenses provided on the second surface of the single crystal silicon layer to correspond to the photodiodes.

The solid-state image sensor according to the present disclosure may further include an insulating film provided on the second surface of the single crystal silicon layer; color filters provided on the insulating film; and on-chip microlenses provided on the color filters to correspond to the photodiodes.

According to the solid-state image sensor and the manufacturing method of the solid-state image sensor of the present disclosure, a solid-state image sensor does not include single crystal silicon produced by CZ growth, which inevitably has variations in impurity concentration. As a result, a solid-state image sensor is obtained, which is free from fixed pattern noise occurring in a solid-state image sensor manufactured by a conventional manufacturing method.

BRIEF DESCRIPTION OF THE DRAWINGS

FIGS. 4A-4E are cross-sectional views illustrating a manufacturing method of the solid-state image sensor according to a second embodiment in order of steps.

DETAILED DESCRIPTION

First Embodiment

Figure 1:
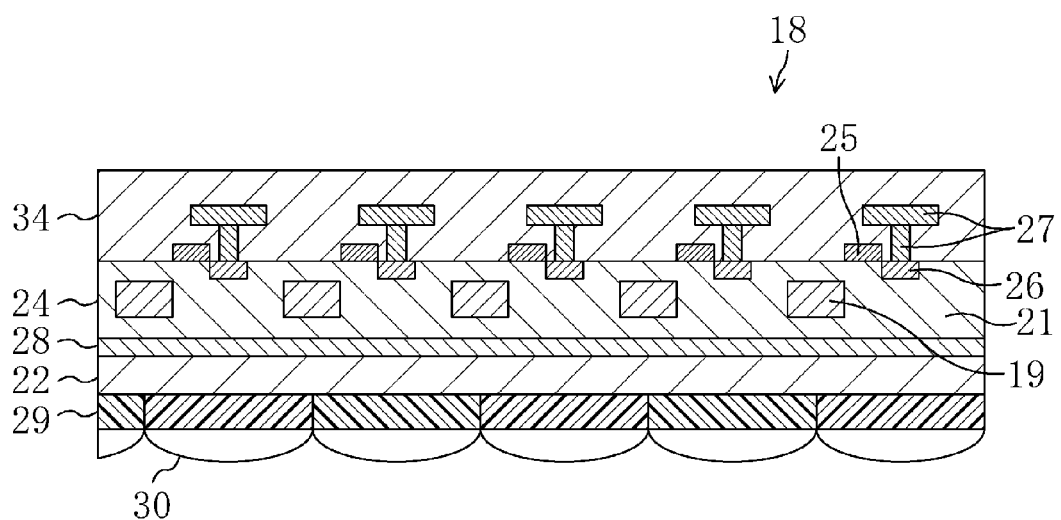
FIG. 1 is a cross-sectional view of a solid-state image sensor according to a first embodiment of the present disclosure.

A solid-state image sensor according to a first embodiment of the present disclosure will be described hereinafter with reference to FIG. 1. FIG. 1 illustrates a cross-sectional structure of the solid-state image sensor according to the first embodiment.

As shown in FIG. 1, the solid-state image sensor according to the first embodiment includes a single crystal silicon layer 24 formed by epitaxial growth, and a silicon oxide layer 22 having a surface formed by heat treatment. Impurities are implanted into the single crystal silicon layer 24 to have p-type conductivity for functioning as a p-well 21.

The single crystal silicon layer 24 includes photodiodes 19 and drains 26. Read-out gates 25 and interconnects 27 are formed on the single crystal silicon layer 24. An interlayer insulating film 34 is formed on the single crystal silicon layer 24 to cover the read-out gates 25 and the interconnects 27. The photodiodes 19 are formed by forming n-type regions by implantation of ions such as arsenic, phosphorus, antimony, etc. The light-receiving sections of the photodiodes 19 are formed to face the silicon oxide layer 22.

For example, boron ($B^+$) ions are implanted from the surface provided with the silicon oxide layer 22, thereby forming the $p^+$ type depletion barrier layer 28 under the single crystal silicon layer 24. The impurity concentration of the depletion barrier layer 28 varies depending on the impurity concentration of the photodiodes 19, and usually preferably ranges from $1\times10^{17}$ cm$^{-3}$ to $1\times10^{19}$ cm$^{-3}$ (both inclusive). This prevents spread of the depletion layers of the photodiodes 19 to the interface with the silicon oxide layer 22, and provides the advantage of reducing dark signals generated by accumulating noise electrons occurring in the interface states at the photodiodes 19.

Color filters 29 are formed on the surface of the silicon oxide layer 22 which is opposite to the single crystal silicon layer 24. On-chip microlenses 30 are formed on the color filters 29.

The solid-state image sensor according to this embodiment does not include single crystal silicon formed by Czochralski (CZ) growth, which inevitably has concentric variations in impurity concentration. This prevents fixed pattern noise to improve image quality.

A manufacturing method of a solid-state image sensor including the above-described structure will be described hereinafter with reference to FIGS. 2A-2E and 3A-3F. FIGS. 2A-2E and 3A-3F illustrate a manufacturing method of the solid-state image sensor according to the first embodiment of the present disclosure in order of steps.

Figure 2A:
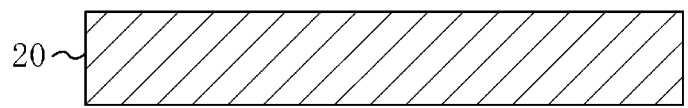
FIGS. 2A-2E are cross-sectional views illustrating a manufacturing method of the solid-state image sensor according to the first embodiment in order of steps.

First, as shown in FIG. 2A, a bond wafer 20 made of single crystal silicon is prepared. In this embodiment, the conductivity type and the impurity concentration of the bond wafer 20 are not directly related to the p-well 21 of the completed solid-state image sensor 18 shown in FIG. 3F. In FIGS. 2A-2E and 3A-3F, the bond wafer 20 is shown with the principal surface facing downward. The bond wafer 20 may be made of single crystal silicon produced by CZ growth.

Figure 2B:
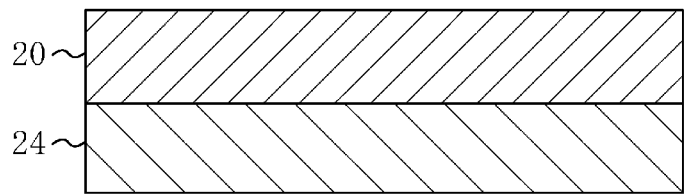

Then, as shown in FIG. 2B, the single crystal silicon layer 24, into which p-type impurities are implanted, is disposed on the principal surface of the bond wafer 20 by epitaxial growth. In this embodiment, the single crystal silicon layer 24 needs to have a thickness greater than the thickness of the surface on which a solid-state image element is eventually formed. Since a solid-state image sensor using visible light with sensitivity needs to include a substrate with a thickness ranging from several micrometers to ten micrometers, the single crystal silicon layer 24 by epitaxial growth needs to have the deposition thickness ranging from several micrometers to ten micrometers.

Figure 2C:
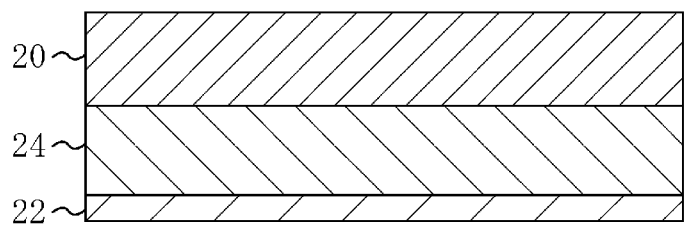

Next, as shown in FIG. 2C, the bond wafer 20 is thermally oxidized to form the silicon oxide layer 22. While only the front (lower) surface of the formed silicon oxide layer 22 is shown in the figure, the silicon oxide layer 22 is actually formed on the back and side surfaces of the bond wafer 20 as well.

Figure 2D:
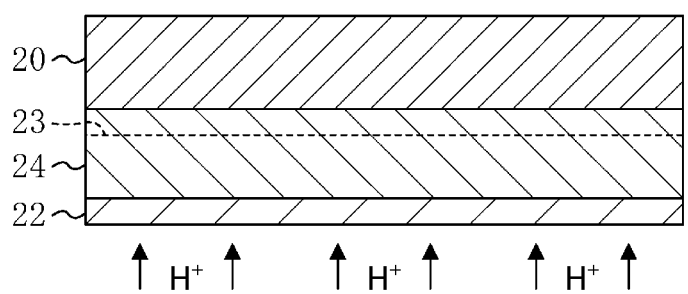

After that, as shown in FIG. 2D, hydrogen ions are implanted to the single crystal silicon layer 24 from the silicon oxide layer 22 to form a defect layer 23 inside the single crystal silicon layer 24. After bonding the bond wafer 20 to a base wafer 17, the bond wafer 20 is separated along the defect layer 23. Thus, accelerated energy in implanting the hydrogen ions is controlled to adjust the depth of the ion implantation, thereby determining the thickness of the single crystal silicon layer 24 in the silicon-on-insulator (SOI) wafer. Therefore, in this embodiment, the depth of the defect layer 23 eventually becomes the thickness of the single crystal silicon forming the solid-state image sensor 18. When the solid-state image sensor 18 of back surface irradiation is formed, it has a thickness ranging from about several micrometers to about ten micrometers as described above. Since the deposition thickness of the single crystal silicon layer 24 by the epitaxial growth shown in FIG. 2B is larger than the thickness of the single crystal silicon forming the solid-state image sensor 18, the defect layer 23 formed by implanting the hydrogen ions is provided in the single crystal silicon layer 24 formed by epitaxial growth.

Figure 2E:
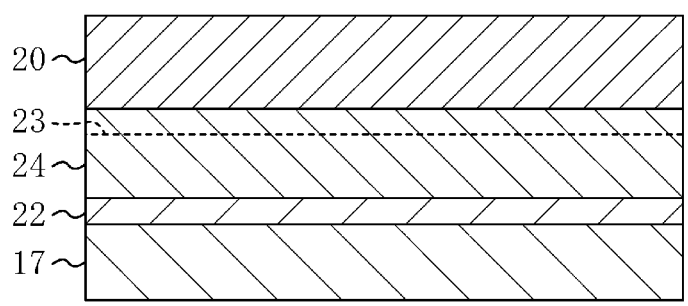
Figure 3A:
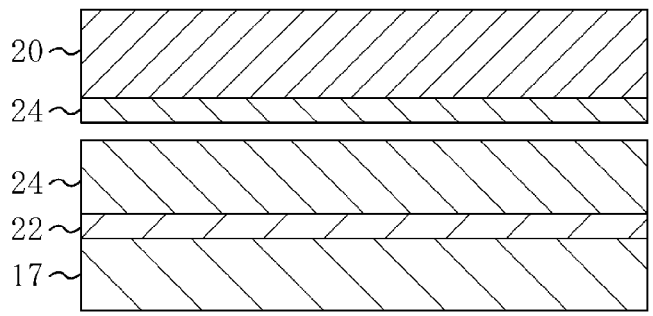
FIGS. 3A-3F are cross-sectional views illustrating the manufacturing method of the solid-state image sensor according to the first embodiment in order of steps.
Figure 3B:
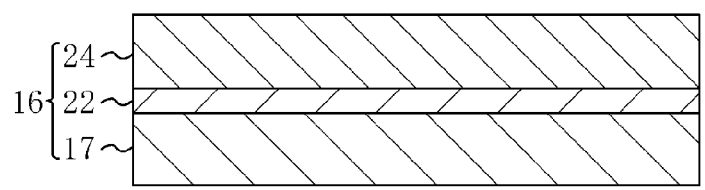

Then, as shown in FIG. 2E, a base wafer 17 for maintaining the strength of an SOI wafer 16 to be completed in FIG. 3B. The surfaces of the prepared base wafer 17 and the single crystal silicon layer 24 are cleaned, and then, the surfaces of the base wafer 17 and the single crystal silicon layer 24 are bonded. At this time, atomic force at the surfaces promotes the bonding only by softly pushing the base wafer 17 and the bond wafer 20, on which the single crystal silicon layer 24 is deposited, since the surfaces are sufficiently flat. The cleaning aims not only to remove contaminated materials, particles, etc. and to make the surfaces hydrophilic to improve bonding effects. In this embodiment, the base wafer 17 may be made of single crystal silicon produced by CZ growth. While the base wafer 17 is shown as if it is thinner than the bond wafer 20 for convenience, the base wafer 17 needs to have a thickness for maintaining the strength of the SOI wafer 16. Therefore, when the diameter is 200 mm or more, a thickness of 500 μm is usually needed. The bond wafer 20 also needs to have the same degree of thickness as the base wafer 17 to be subjected to the steps to bonding of the bond wafer 20 to the base wafer 17.

After that, as shown in FIG. 3A, when the base wafer 17 and the bond wafer 20 are separated from the back surface, the single crystal silicon layer 24 is separated in the defect layer 23. Part of the bond wafer 20 and the single crystal silicon layer 24 eparated from the base wafer 17 may be returned to the epitaxial growth shown in FIG. 2B and reused in manufacture of another SOI wafer.

Then, heat treatment is performed to strengthen the bonding of bonded surfaces. The temperature of the heat treatment is 400° C. or more in view of the bonding strength, and is preferably about 1000° C.

With the above-described steps, the SOI wafer 16 including the base wafer 17, the silicon oxide layer 22, and the single crystal silicon layer 24 is completed as shown in FIG. 3B. In the SOI wafer 16 formed in this embodiment, the entire single crystal silicon layer 24 is formed by epitaxial growth. Thus, the SOI wafer 16 formed in this embodiment has fewer variations in impurity concentration than a conventional single crystal silicon layer produced by CZ growth.

Figure 3C:
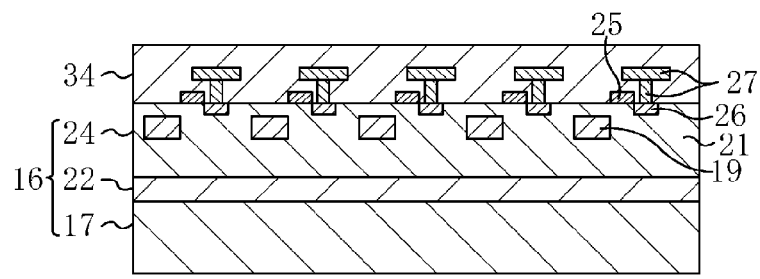

Next, as shown in FIG. 3C, the photodiodes 19 and the drains 26 are formed in the single crystal silicon layer 24, and the read-out gates 25 and the interconnects 27 are formed on the single crystal silicon layer 24 to form a solid-state MOS image sensor. In the case of a solid-state charge coupled device (CCD) image sensor, photodiodes, charge transfer sections, gate electrodes and interconnects are used instead. In this embodiment, the photodiodes 19 are formed in the p-type single crystal silicon layer 24. Thus, in forming the photodiodes 19, impurities such as arsenic, phosphorus, antimony, etc. are ion-implanted to form an n-type region. The interlayer insulating film 34 is formed on the single crystal silicon layer 24 to cover the read-out gates 25 and the interconnects 27.

Note that, in this embodiment, in FIG. 2B, the single crystal silicon layer 24 having p-type conductivity is formed by epitaxial growth. The single crystal silicon layer 24 may be of an n-type, and the p-well 21 may be formed by ion implantation etc. in the step shown in FIG. 3C to form the photodiodes 19 etc. in the formed p-well 21.

Figure 3D:
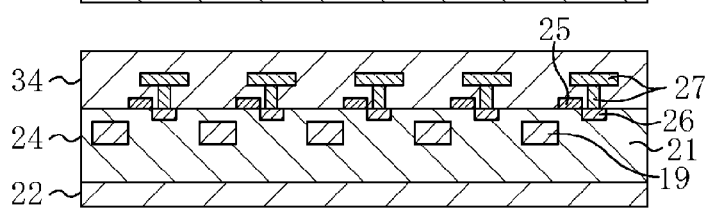

Then, as shown in FIG. 3D, the base wafer 17 is removed. It is efficient to perform etching with an alkali solution after removing a large part of the base wafer 17 by polishing, dry etching, etc. However, only etching with an alkali solution suffices. Since the base wafer 17 is made of single crystal silicon, removal is facilitated by etching with an alkali solution. Furthermore, the intermediate silicon oxide layer 22 is not etched by an alkali solution, and serves as an etching stopper. This enables processing of thinning films with high accuracy in the case where the thickness of the SOI wafer 16 is determined mainly by the depth of hydrogen ion implantation. The greatest advantage of using the SOI wafer 16 is that the thickness accuracy is dramatically high as compared to the case where a single layer single crystal silicon wafer with a thickness of 500 μm or more is processed to a thickness of about 10 μm by combining polishing and etching. Removal of the base wafer 17 may be limited to the light-receiving region of the solid-state image sensor 18 using a masking step. When the base wafer 17 is removed from the entire surface of the SOI wafer 16, the strength of the entire wafer is insufficient. Thus, the SOI wafer 16 is preferably strengthen by bonding a quartz wafer etc. as a support wafer on the front surface provided with the interconnects 27 etc. in advance. Note that the support wafer is not shown in the figure. In this embodiment, an example has been described where only the base wafer 17 is removed. Even when selectively removing the silicon oxide layer 22 by etching with acid after removing the base wafer 17 with an alkali solution etc., the processing accuracy of the thickness is not different and the advantage of using the SOI wafer 16 can be provided.

Figure 3E:
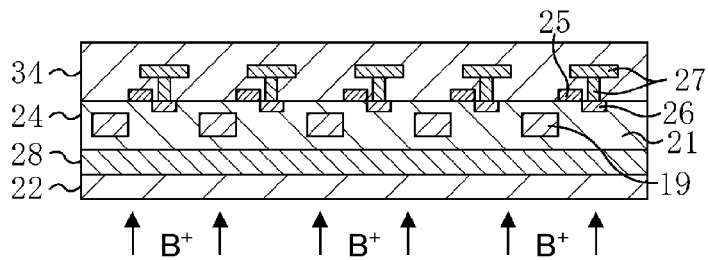

Then, as shown in FIG. 3E, boron ions are implanted from the surface provided with the silicon oxide layer 22 to form a $p^+$ type depletion barrier layer 28 near the interface in the single crystal silicon layer 24 between the single crystal silicon layer 24 and the silicon oxide layer 22. The concentration of the depletion barrier layer 28 varies depending on the impurity concentration of the photodiodes 19, but usually preferably ranges from $1\times10^{17}$ cm$^{-3}$ to $1\times10^{19}$ cm$^{-3}$ (both inclusive). This blocks spread of the depletion layers of the photodiodes 19 to the interface with the silicon oxide film and prevents noise electrons generated at interface states from being accumulated at the photodiodes 19 and becoming dark signals. Note that, even when the step is omitted, basic functions as an image sensor can be obtained although image quality is degraded.

Figure 3F:
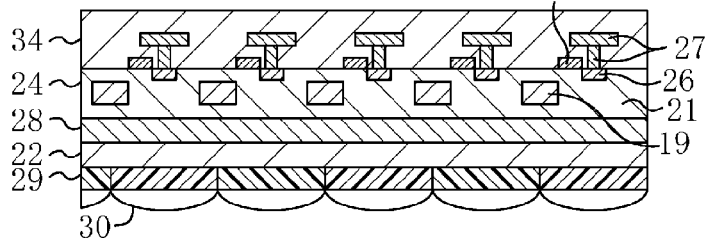
Figure 4E:
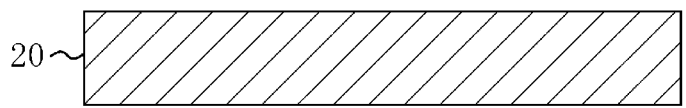
Figure 4B:
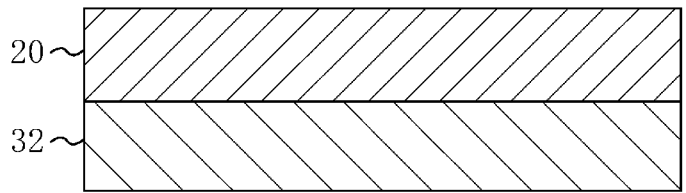
Figure 4C:
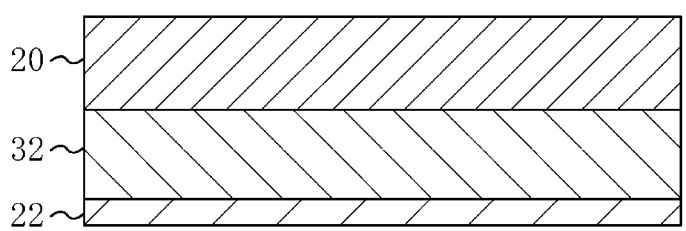
Figure 4D:
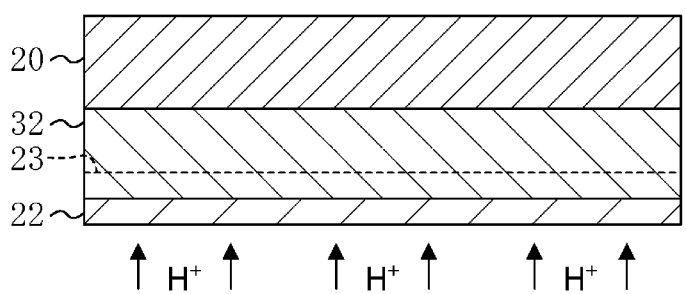
Figure 4E:
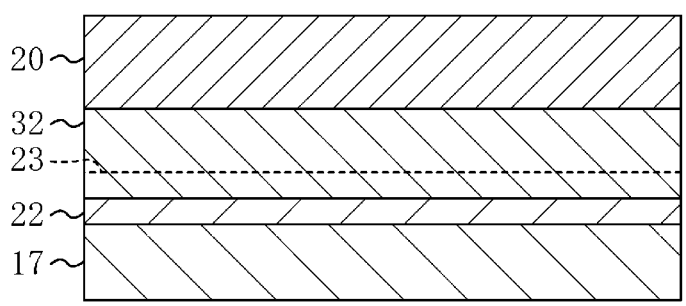

After that, as shown in FIG. 3F, color filters 29 and on-chip microlenses 30 are formed on the silicon oxide layer 22 as necessary. As a result, the solid-state image sensor 18 of back surface irradiation is completed, which is formed of the single crystal silicon layer 24 by epitaxial growth.

Figure 12:
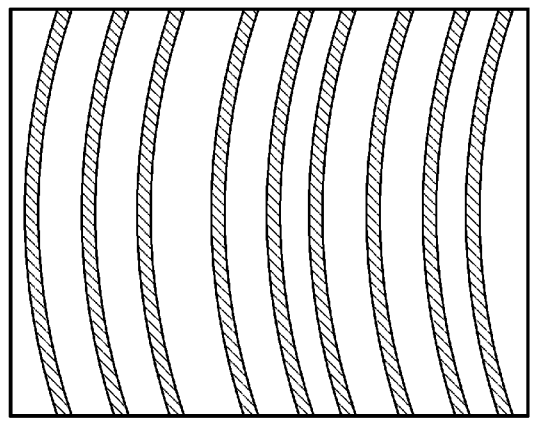
FIG. 12 is a schematic view illustrating fixed pattern noise of a solid-state image sensor of back surface irradiation using a conventional SOI wafer.

In the manufacturing method of the solid-state image sensor according to this embodiment, the solid-state image sensor 18 does not include single crystal silicon produced by CZ growth, which inevitably has concentric variations in impurity concentration. As a result, the solid-state image sensor free from fixed pattern noise as shown in FIG. 12 can be manufactured.

While in this embodiment, the solid-state image sensor of back surface irradiation has been described, a conventional solid-state image sensor of front surface irradiation can be manufactured similarly using an SOI wafer. Thinning a light-receiving region in a solid-state image sensor of front surface irradiation is advantageous in for example, allowing specific short wavelength to have sensitivity, and utilizing transmitted light of the solid-state image sensor for some purposes. In this case, the depletion barrier layer 28 shown in FIG. 3E needs to be formed by implanting boron ions to the surface of the single crystal silicon layer 24 which is opposite to the above-described surface. The formation is performed in the step shown in FIG. 3D.

While in this embodiment, a manufacturing method has been described using a solid-state MOS image sensor as an example, a similar manufacturing method is applicable using an SOI wafer in a solid-state CCD image sensor.

While in this embodiment, an example has been described where the photodiodes 19 are formed in the p-well 21, the manufacturing method of the solid-state image sensor of the present disclosure is applicable with a well of the other conductivity type.

While in this embodiment, an example has been described where hydrogen ion implantation separation is used, similar advantages can be obtained by other separation methods used in Uni Bond, for example, ion implantation separation using argon ions etc. other than hydrogen ions.

Second Embodiment

A manufacturing method of a solid-state image sensor according to a second embodiment will be described hereinafter with reference to FIGS. 4A-4E and 5A-5G.

FIGS. 4A-4E and 5A-5G illustrate a manufacturing method of the solid-state image sensor according to the second embodiment of the present disclosure in order of steps.

The steps shown in FIGS. 4A-5B are similar to the steps of the first embodiment shown in FIGS. 2A-3B, and explanation thereof will be omitted. Note that the single crystal silicon layer 24 of the first embodiment corresponds to a first single crystal silicon layer 32 in this embodiment.

Figure 5A:
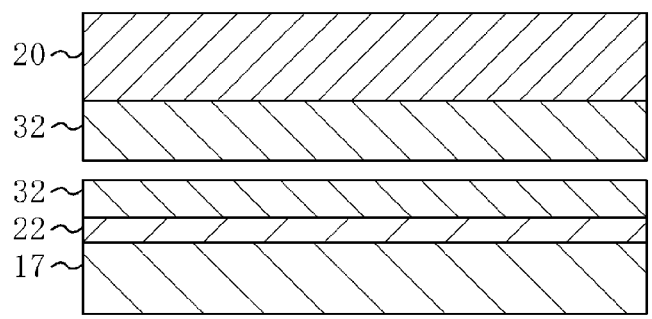
FIGS. 5A-5G are cross-sectional views illustrating the manufacturing method of the solid-state image sensor according to the second embodiment in order of steps.
Figure 5B:
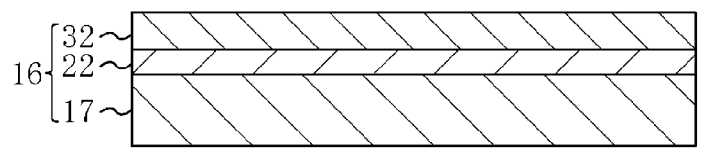
Figure 5C:
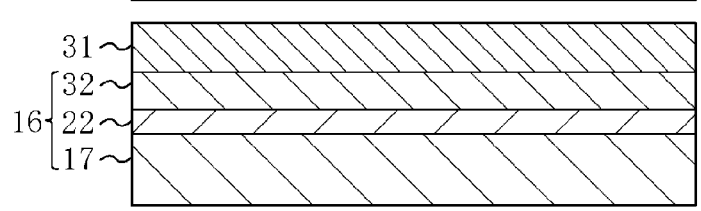

As shown in FIG. 5C, a second single crystal silicon layer 31 is deposited on the first single crystal silicon layer 32 by epitaxial growth. P-type impurities are implanted into the second single crystal silicon layer 31. As a result, the sum of the thickness of the seperated first single crystal silicon layer 32 and the thickness of the second single crystal silicon layer 31 is the substrate thickness of the solid-state image sensor 18 shown in FIG. 5G. As described above, the substrate needs to have a thickness ranging from about several micrometers to about ten micrometers in a solid-state image sensor of back surface irradiation. Therefore, where the depth of the defect layer 23 in the first single crystal silicon layer 32 is d1, and the thickness of the deposited second single crystal silicon layer 31 in FIG. 5C is d2, the sum of d1 and d2 needs to be equal to the substrate thickness of the solid-state image sensor 18.

Figure 5D:
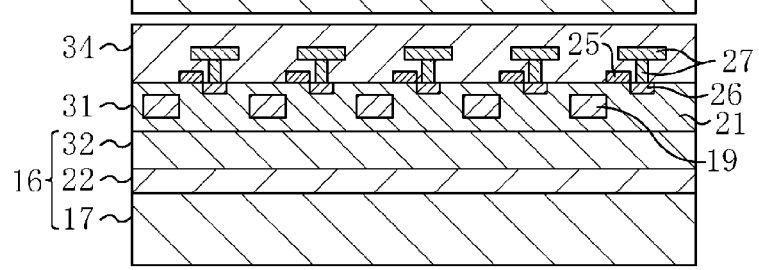

Then, as shown in FIG. 5D, photodiodes 19 and drains 26 are formed on the second single crystal silicon layer 31, and read-out gates 25 and interconnects 27 are formed on the second single crystal silicon layer 31 to form a solid-state MOS image sensor. In the case of a solid-state CCD image sensor, photodiodes, charge transfer sections, gate electrodes and interconnects are used instead. In this embodiment, since the photodiodes 19 are formed in the second single crystal silicon layer 31, impurities such as arsenic, phosphorus, antimony, etc. are ion-implanted in forming the photodiodes 19 to form an n-type region. Furthermore, the interlayer insulating film 34 is formed on the single crystal silicon layer 24 to cover over the read-out gates 25 and the interconnects 27.

Note that, in this embodiment, the second single crystal silicon layer 31 of n-type conductivity may be formed by epitaxial growth, a p-well 21 may be formed by ion implantation etc., and the photodiodes 19 etc. may be formed in the p-well 21.

Figure 5E:
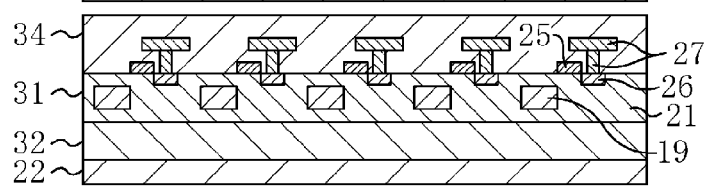

Next, as shown in FIG. 5E, the base wafer 17 is removed. It is efficient to perform etching with an alkali solution after removing a large part of the base wafer 17 by polishing, dry etching, etc. However, only etching with an alkali solution suffices. Since the base wafer 17 is made of single crystal silicon, removal is facilitated by etching with an alkali solution. Furthermore, the intermediate silicon oxide layer 22 is not etched by an alkali solution, and serves as an etching stopper. This enables processing of thinning films with high accuracy in the case where the thickness of the SOI wafer 16 is determined mainly by the depth of hydrogen ion implantation. The greatest advantage of using the SOI wafer 16 is that the thickness accuracy is dramatically high as compared to the case where a single layer single crystal silicon wafer with a thickness of 500 µm or more is processed to a thickness of about 10 µm by combining polishing and etching. Removal of the base wafer 17 may be limited to the light-receiving region of the solid-state image sensor 18 using a masking step. When the base wafer 17 is removed from the entire surface of the SOI wafer 16, the strength of the entire wafer is insufficient. Thus, the SOI wafer 16 is preferably strengthen by bonding a quartz wafer etc. as a support wafer on the front surface provided with the interconnects 27 etc. in advance. Note that the support wafer is not shown in the figure. In this embodiment, an example has been described where only the base wafer 17 is removed. Even when selectively removing the silicon oxide layer 22 by etching with acid after removing the base wafer 17 with an alkali solution etc, the processing accuracy of the thickness is not different and the advantage of using the SOI wafer 16 can be provided.

Figure 5F:
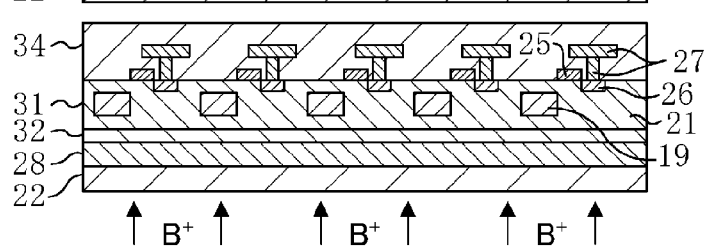

Then, as shown in FIG. 5F, boron ions are implanted from the surface provided with the silicon oxide layer 22 to form a $p^+$ type depletion barrier layer 28 near the interface in the first single crystal silicon layer 32 between the first single crystal silicon layer 32 and the silicon oxide layer 22. The concentration of the depletion barrier layer 28 varies depending on the impurity concentration of the photodiodes 19, but usually preferably ranges from $1\times10^{17}$ cm$^{-3}$ to $1\times10^{19}$ cm$^{-3}$ (both inclusive). This blocks spread of the depletion layers of the photodiodes 19 to the interface with the silicon oxide layer 22 and prevents noise electrons generated at interface states from being accumulated at the photodiodes 19 and becoming dark signals. Note that, even when the step is omitted, basic functions as an image sensor can be obtained although image quality is degraded.

Figure 5G:
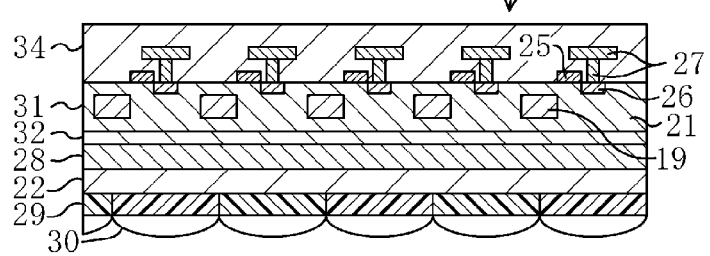
Figure 6A:
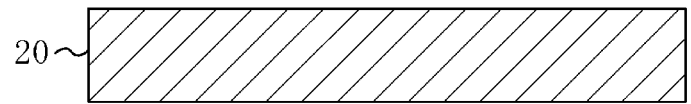
FIGS. 6A-6E are cross-sectional views illustrating a manufacturing method of the solid-state image sensor according to a third embodiment in order of steps.
Figure 6B:
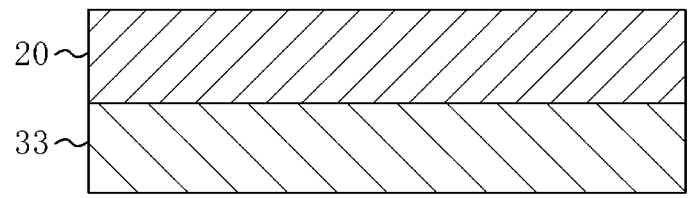
Figure 6C:
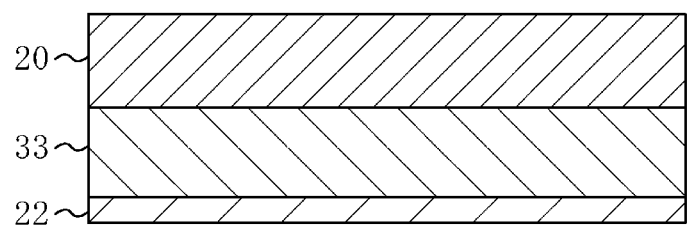
Figure 6D:
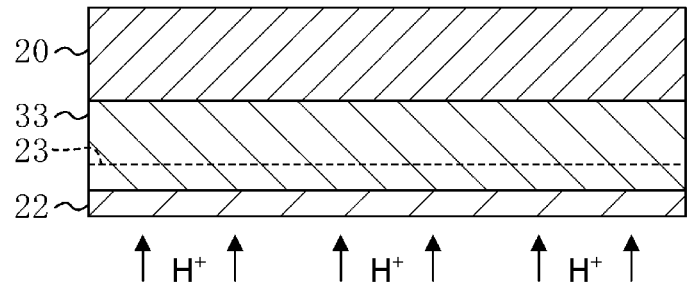
Figure 6E:
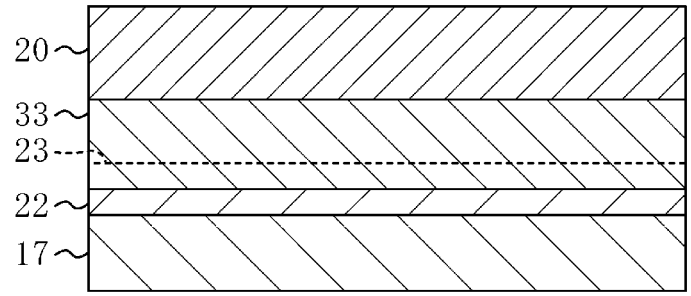

After that, as shown in FIG. 5G, color filters 29 and on-chip microlenses 30 are formed on the silicon oxide layer 22 as necessary. As a result, the solid-state image sensor 18 of back surface irradiation is completed, which is formed of the first single crystal silicon layer 32 and the second single crystal silicon layer 31 by epitaxial growth.

In the manufacturing method of the solid-state image sensor according to this embodiment, the solid-state image sensor 18 does not include single crystal silicon produced by CZ growth, which inevitably has concentric variations in impurity concentration. As a result, the solid-state image sensor free from fixed pattern noise as shown in FIG. 12 can be manufactured.

In this embodiment, the SOI wafer 16 is formed by hydrogen ion implantation separation. A large part of the defect layer 23 due to ion implantation remains on the surface separated by hydrogen ion implantation. Thus, when the read-out gates 25, the drains 26, the interconnects 27, etc. are formed on the surface separated by hydrogen ion implantation; threshold voltages vary at the read-out gates 25 due to an increase in interface states, dark outputs increase at the drains 26, and an increase in contact resistance, variations in resistance, etc. at the interconnects 27, thereby causing degradation in image equality due to an increase in noise etc. as a solid-state image sensor. In this embodiment, since the second single crystal silicon layer 31 is formed on a first single crystal silicon layer 32 including a surface on which a large part of the defect layer 23 remains. Thus, the read-out gates 25, the drains 26, the interconnects 27, etc. of the solid-state image sensor 18 can be formed on the surface of the defect free second single crystal silicon layer 31. This improves image quality of the image sensor. Furthermore, epitaxial growth of single crystal silicon is usually performed with silane source gas at a high temperature of 1000° C. Thus, hydrogen atoms ion-implanted from the silicon oxide layer 22 into the first single crystal silicon layer 32 desorb to recover defects caused by ion implantation.

The interface between the first single crystal silicon layer 32 and the second single crystal silicon layer 31 does not preferably exist in the depletion layers of the photodiodes 19. The crystal defects remaining inside the photodiodes 19 are the source of dark currents, and cause fixed pattern noise called "white defects." In this embodiment, the thickness d1 of the separated first single crystal silicon layer 32 is set to be less than the thickness of the depletion barrier layer 28, thereby positioning the interface between the first single crystal silicon layer 32 and the second single crystal silicon layer 31 inside the depletion barrier layer 28. As a result, the structure is formed in which the interface between the first single crystal silicon layer 32 and the second single crystal silicon layer 31 does not exist in the depletion layers of the photodiodes 19. This structure further improves image quality of a solid-state image sensor.

While in this embodiment, an example has been described where hydrogen ion implantation separation is used, similar advantages can be obtained by other separation methods used in Uni Bond, for example, ion implantation separation using argon ions etc. other than hydrogen ions.

Third Embodiment

A manufacturing method of a solid-state image sensor according to a third embodiment will be described hereinafter with reference to FIGS. 6A-6E and 7A-7F.

FIGS. 6A-6E and 7A-7F illustrate a manufacturing method of the solid-state image sensor according to the third embodiment of the present disclosure in order of steps. FIG. 8 is a schematic view illustrating fixed pattern noise caused by variations in activation of laser annealing.

The steps shown in FIGS. 6A-7E are similar to the steps of the second embodiment shown in FIGS. 4A-5E, and explanation thereof will be omitted. Note that the first single crystal silicon layer 32 according to the second embodiment corresponds to a first depletion barrier single crystal silicon layer 33 in this embodiment. The first depletion barrier single crystal silicon layer 33 is made of single crystal silicon having the same conductivity type as the depletion barrier layer 28 shown in FIG. 5F and impurity concentration equal to that of the depletion barrier layer 28, i.e., having P+ type conductivity and impurity concentration ranging from $1\times10^{17}$ cm$^{-3}$ to $1\times10^{19}$ cm$^{-3}$ (both inclusive). In the hydrogen ion implantation shown in FIG. 6D, the defect layer 23 formed by hydrogen ion implantation has a depth equal to the thickness of the depletion barrier layer 28 of the first and second embodiments, thereby allowing the first depletion barrier single crystal silicon layer 33 to function as the depletion barrier layer 28 of the first and second embodiments. As a result, implantation of B+ ions is unnecessary. In this respect, this embodiment differs from the other embodiments.

Figure 7A:
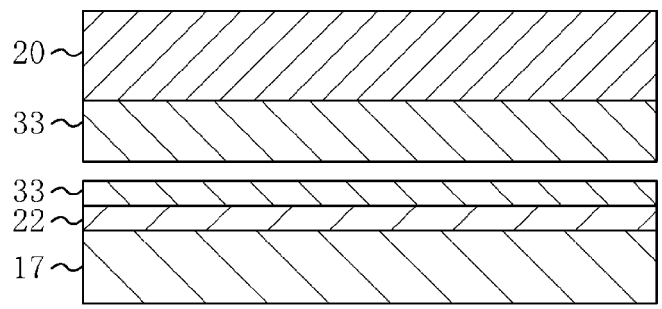
FIGS. 7A-7F are cross-sectional views illustrating the manufacturing method of the solid-state image sensor according to the third embodiment in order of steps.
Figure 7B:
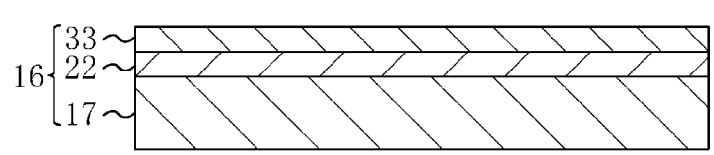
Figure 7C:
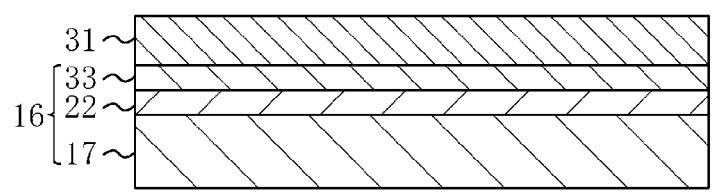
Figure 7D:
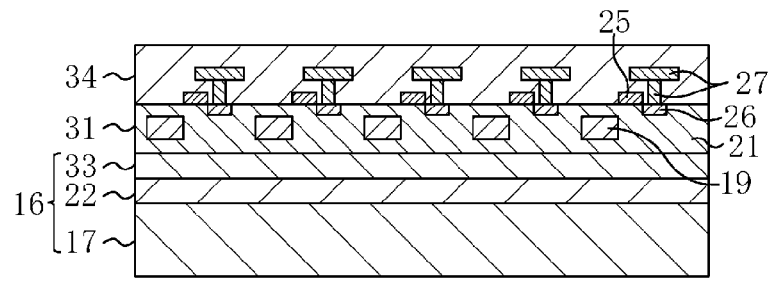
Figure 7E:
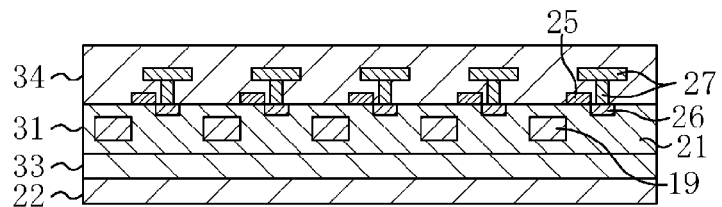
Figure 7F:
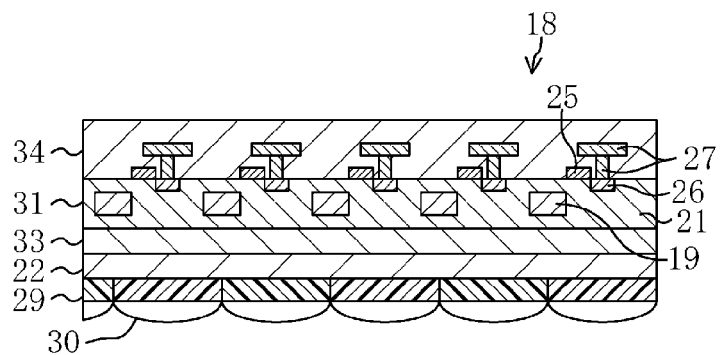
Figure 8:
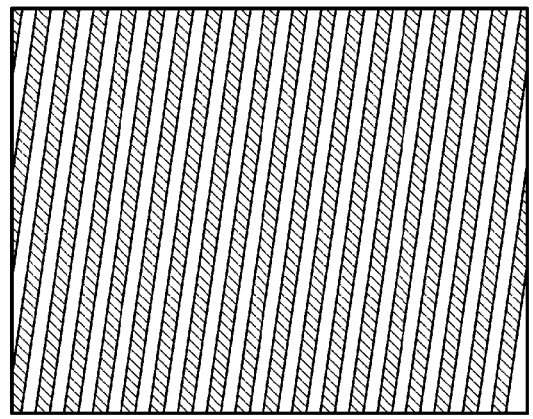
FIG. 8 is a schematic view illustrating fixed pattern noise caused by variations in activation of laser annealing.
Figure 9:
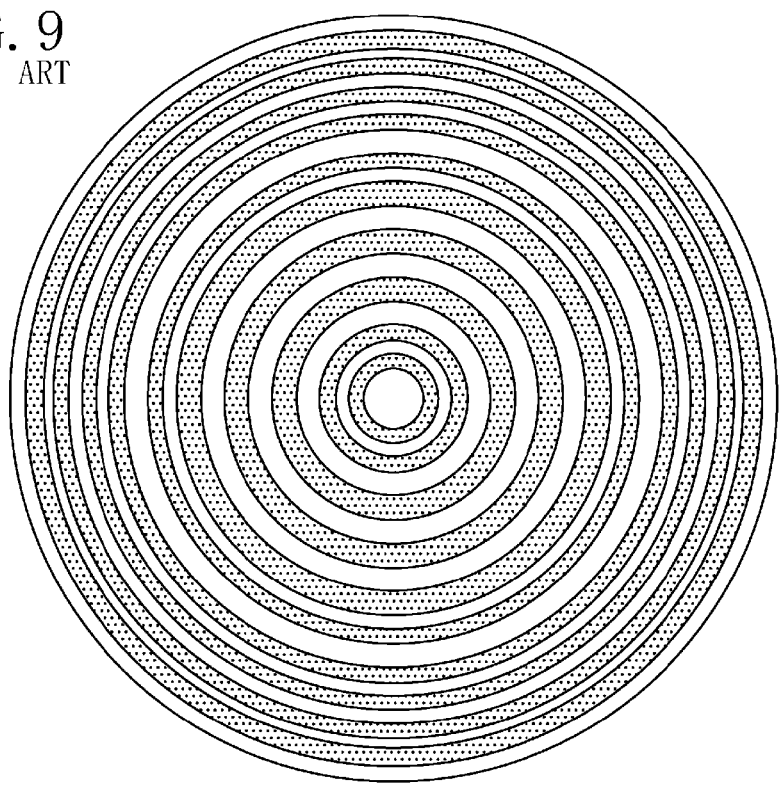
FIG. 9 is a schematic view illustrating variations in impurity concentration in a semiconductor wafer manufactured by conventional CZ growth.
Figure 10A:
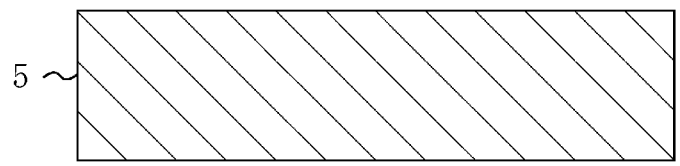
FIGS. 10A-10E are cross-sectional views illustrating a manufacturing method of a solid-state image sensor of back surface irradiation using a conventional SOI wafer in order of steps.
Figure 10B:
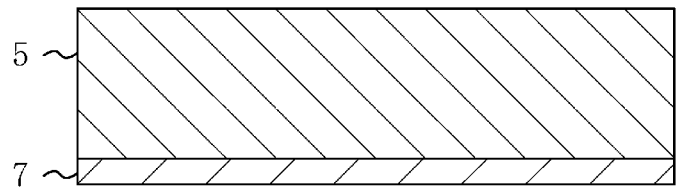
Figure 10C:
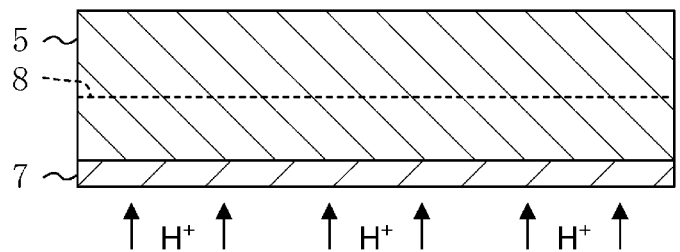
Figure 10D:
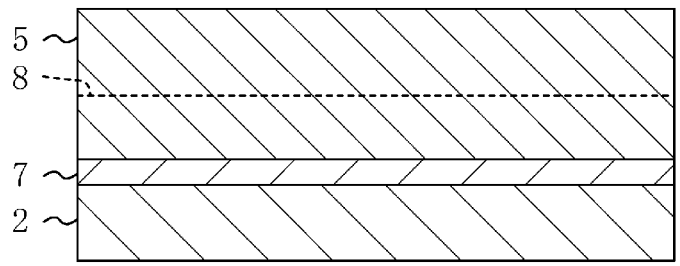
Figure 10E:
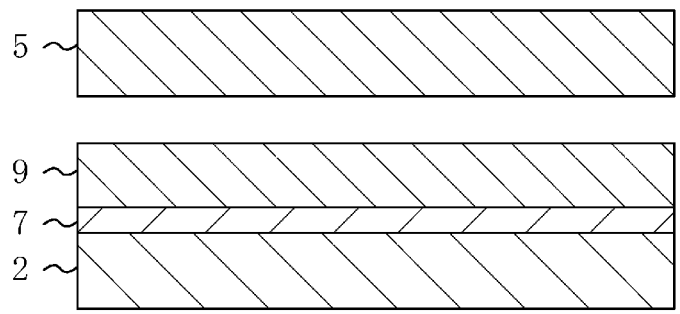
Figure 11A:
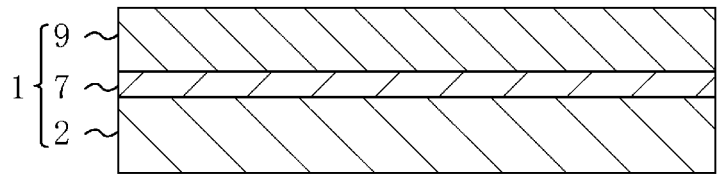
FIGS. 11A-11E are cross-sectional views illustrating a manufacturing method of a solid-state image sensor of back surface irradiation using a conventional SOI wafer in order of steps.
Figure 11B:
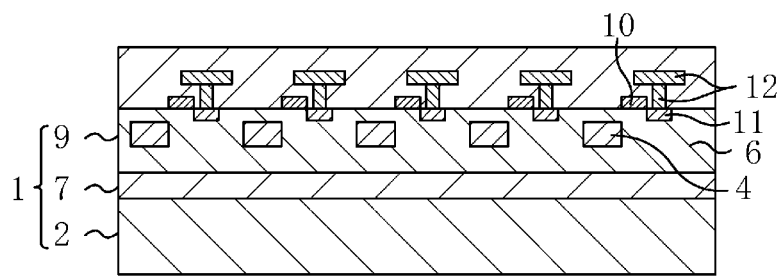
Figure 11C:
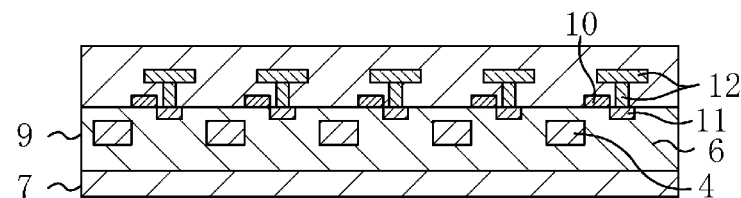
Figure 11D:
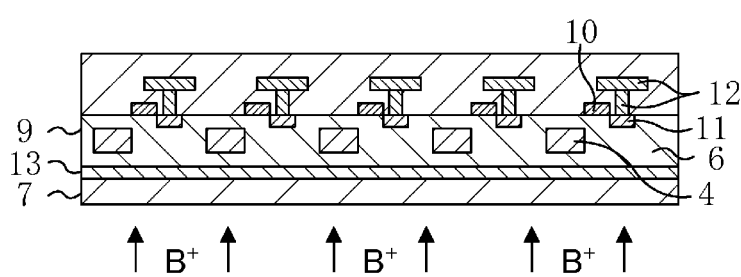
Figure 11E:
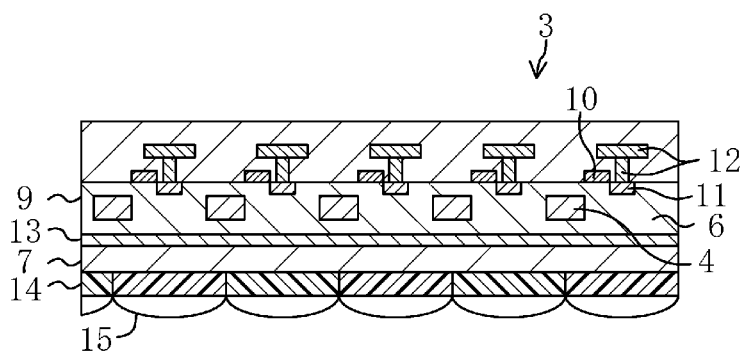

Specifically, in this embodiment, after removing the base wafer 17 by etching shown in FIG. 7E, color filters 29, on-chip microlenses 30, etc. are formed the silicon oxide layer 22 as necessary, as shown in FIG. 7F. As a result, the solid-state image sensor 18 of back surface irradiation made only of single crystal silicon by epitaxial growth is completed.

In order to allow the single crystal silicon to have electrical characteristics of a desired conductivity type by implantation of impurity ions such as boron, impurity atoms need to be located in stable positions in the single crystal silicon by heat treatment generally called "activation annealing." The activation annealing needs to be performed by heat treatment at a temperature of 800° C. or more. However, when the read-out gates 25, the interconnects 27, etc. are already formed, and particularly, when the interconnects 27 are made of metal such as aluminum or copper, the temperature applied to the entire wafer is considered based on the melting point of the interconnects 27. Heating at a temperature of 500° C. or more is difficult. As a result, only part of ion-implanted impurities can be activated.

As a method of solving this problem, heating called "laser annealing" can be used. In this method, a wafer is scanned with intense laser light to heat the entire surface of the wafer. This locally heats one of the surfaces of the wafer. There are however two problems in this method. The first problem is heat variations caused by scanning with laser light. The maximum radius of laser light ranges from hundreds of micrometers to several millimeters, which is smaller than a solid-state image sensor and greater than a pixel size of the solid-state image sensor. The heat variations caused by scanning of the laser light lead to variations in activation of impurities to cause variations in conductivity characteristics. This results in variations in characteristics of individual pixels of the solid-state image sensor so that fixed pattern noise caused by scanning variations of the laser light shown in FIG. 8 occurs in the obtained image, thereby causing degradation in image quality. The second problem is that the front surface (upper surface) of the wafer 16 has a high temperature, even when the SOI wafer 16 is irradiated with laser light from the back surface, since the thickness of the formation region of the photodiodes 19 ranges from several micrometers to ten micrometers. In particular, as one of the advantages of a solid-state image sensor of back surface irradiation, the layout of the interconnects 27 at the front surface is not limited by arrangement of pixels. However, when the wafer 16 transmits part of laser light from the back surface and the interconnects 27 reflects the part of laser light from the back surface, the temperature of the irradiated part with the reflected light rises more than the other parts. This may cause variations in activation of impurities reflecting the layout of the interconnects 27, and fixed pattern noise of other types than the fixed pattern noise caused by scanning variations may be a concern. While the above-described problems may be solved, when laser annealing techniques with a short wavelength is developed, the heat treatment in processing the back surface is an essential problem of a solid-state image sensor of back surface irradiation.

In the manufacturing method of the solid-state image sensor according to this embodiment, there is no need to form the depletion barrier layer 28 by ion implantation to perform activation annealing, after forming the read-out gates 25 and the interconnects 27. Therefore, fixed pattern noise caused by the activation annealing can be avoided.

When the impurity concentration of the first depletion barrier single crystal silicon layer 33 is sufficiently high, depletion does not occur at the interface between the first depletion barrier single crystal silicon layer 33 and the second single crystal silicon layer 31, and the interface is not included inside the photodiodes 19. As a result, white defects do not occur to obtain excellent image quality.

While in this embodiment, an example has been described where hydrogen ion implantation separation is used, similar advantages can be obtained by other separation methods used in Uni Bond, for example, ion implantation separation using argon ions etc. other than hydrogen ions, similar to the first embodiment.

While in this embodiment, the second single crystal silicon layer 31 is of p-type conductivity and the photodiodes 19 is of n-type conductivity, the second single crystal silicon layer 31 may be of the n-type conductivity. In this case, a p-well is formed in the second single crystal silicon layer 31 by ion implantation etc., and the photodiodes 19 of n-type conductivity may be provided in the formed p-well.

The solid-state image sensor and the manufacturing method of the solid-state image sensor according to the present disclosure provide a solid-state image sensor not including single crystal silicon produced by CZ growth which inevitably has concentric variations in impurity concentration. This prevents fixed pattern noise, and thus, the solid-state image sensor and the manufacturing method of the solid-state image sensor according to the present disclosure are particularly useful as a solid-state image sensor and a manufacturing method etc. of the solid-state image sensor using an SOI substrate.

What is claimed is:

1. A manufacturing method of a solid-state image sensor comprising:
    forming a first single crystal silicon layer on a principal surface of a first wafer by epitaxial growth;
    forming a silicon oxide layer on the first single crystal silicon layer;
    forming a defect layer inside the first single crystal silicon layer by ion implantation;
    bonding a second wafer to the silicon oxide layer on the first wafer;
    forming an SOI wafer including the silicon oxide layer formed on the second wafer and the first single crystal silicon layer formed on the silicon oxide layer by separating the first wafer including the first single crystal silicon layer from the second wafer including the first single crystal silicon layer in the defect layer;
    forming a second single crystal silicon layer on the first single crystal silicon layer by epitaxial growth;
    forming a photodiode in the first single crystal silicon layer or the second single crystal silicon layer; and
    forming an interconnect layer including a photodiode charge read-out structure on a surface of the second single crystal silicon layer which is opposite to the first single crystal silicon layer.

2. The method of claim 1, further comprising
    after forming the interconnect layer, selectively etching part of or the entire second wafer with respect to the silicon oxide layer, wherein
    in forming the photodiode, the light-receiving section of the photodiode is formed to face the silicon oxide layer.

3. A manufacturing method of a solid-state image sensor comprising:
    forming a first single crystal silicon layer having impurity concentration of $1 \times 10^{17}$ cm$^{-3}$ or more on a principal surface of a first wafer by epitaxial growth;
    forming a silicon oxide layer on the first single crystal silicon layer;
    forming a defect layer inside the first single crystal silicon layer by ion implantation;
    bonding a second wafer to the silicon oxide layer on the first wafer;
    forming an SOI wafer including the silicon oxide layer formed on the second wafer and the first single crystal silicon layer formed on the silicon oxide layer by separating the first wafer including the first single crystal silicon layer from the second wafer including the first single crystal silicon layer in the defect layer;
    forming a second single crystal silicon layer having lower impurity concentration than the first single crystal silicon layer on the first single crystal silicon layer by epitaxial growth;
    forming a photodiode in the second single crystal silicon layer so that a light-receiving section faces the silicon oxide layer;
    forming an interconnect layer including a photodiode charge read-out structure on a surface of the second single crystal silicon layer which is opposite to the first single crystal silicon layer; and
    selectively etching part of or the entire second wafer with respect to the silicon oxide layer.

4. The method of claim 3, wherein
    the first single crystal silicon layer is of a first conductivity type,
    the second single crystal silicon layer is of a second conductivity type, and
    the photodiode is of the second conductivity type.

5. The method of claim 3, wherein
    the first single crystal silicon layer is of a first conductivity type,
    the second single crystal silicon layer is of a second conductivity type,
    the forming of the photodiode includes forming a well of the first conductivity type in the second single crystal silicon layer, and
    the photodiode is of the second conductivity type, and is formed in the well.

* * * * *